United States Patent
Yoshino

(10) Patent No.: US 9,397,026 B2
(45) Date of Patent: Jul. 19, 2016

(54) SEMICONDUCTOR DEVICE HAVING FLAT LEADS

(71) Applicant: SEIKO INSTRUMENTS INC., Chiba (JP)

(72) Inventor: Tomoyuki Yoshino, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/172,247

(22) Filed: Feb. 4, 2014

(65) Prior Publication Data

US 2014/0217602 A1     Aug. 7, 2014

(30) Foreign Application Priority Data

Feb. 7, 2013    (JP) .................................. 2013-022649

(51) Int. Cl.
     *H01L 23/495*      (2006.01)

(52) U.S. Cl.
     CPC .... *H01L 23/49503* (2013.01); *H01L 23/49548* (2013.01); *H01L 23/49582* (2013.01); *H01L 2224/48095* (2013.01); *H01L 2224/48247* (2013.01); *H01L 2924/181* (2013.01); *H01L 2924/1815* (2013.01)

(58) Field of Classification Search
     CPC ................... H01L 23/49548; H01L 23/49503; H01L 23/49582
     USPC .................... 257/666, 676, 686, 670; 438/123
     See application file for complete search history.

(56) References Cited

U.S. PATENT DOCUMENTS

| | | | |
|---|---|---|---|
| 4,827,611 A * | 5/1989 | Pai et al. .......................... | 29/843 |
| 4,949,223 A * | 8/1990 | Achiwa .......................... | 361/776 |
| 5,286,999 A * | 2/1994 | Chiu .............................. | 257/666 |
| 5,440,452 A * | 8/1995 | Kitahara ........................ | 361/773 |
| 5,604,376 A * | 2/1997 | Hamburgen et al. ......... | 257/676 |
| 5,886,404 A * | 3/1999 | You ..................... | H01L 23/4951 |
| | | | 257/692 |
| 6,211,462 B1 * | 4/2001 | Carter et al. .................. | 174/522 |
| 7,202,460 B2 * | 4/2007 | Onodera ............ | H01L 21/4832 |
| | | | 250/208.1 |
| 8,969,138 B2 * | 3/2015 | Shimanuki ..................... | 438/123 |
| 2002/0020929 A1 * | 2/2002 | Kasuga et al. ................ | 257/787 |
| 2002/0024127 A1 * | 2/2002 | Sakuraba et al. ............. | 257/686 |
| 2003/0164554 A1 * | 9/2003 | Fee et al. ....................... | 257/787 |
| 2005/0104168 A1 * | 5/2005 | Choi et al. ..................... | 257/666 |
| 2006/0017141 A1 * | 1/2006 | Luo et al. ....................... | 257/666 |
| 2006/0131737 A1 * | 6/2006 | Im et al. ........................ | 257/717 |

(Continued)

OTHER PUBLICATIONS

Patent Abstracts of Japan, Publication No. 2000-299400, Publication Date Oct. 24, 2000.

(Continued)

*Primary Examiner* — Nicholas Tobergte
(74) *Attorney, Agent, or Firm* — Adams & Wilks

(57) ABSTRACT

A semiconductor device comprises a semiconductor chip mounted on an island, and a plurality of leads spaced form the island and connected by wires to the semiconductor chip. An insulating film encapsulates the island, the semiconductor chip, the wires and the leads, and the insulating resin has a concave portion that is in contact with the leads. Each lead has a bottom surface exposed from the insulating resin, and the concave portion of the insulating resin exposes side surfaces which surround the bottom surface of each of the leads located under a bottom surface of the insulating resin. When the semiconductor device is soldered to a circuit board, the concave portion prevents contact between the solder and the insulating resin and improves self-alignment of the semiconductor device on the circuit board.

15 Claims, 10 Drawing Sheets

(56) References Cited

U.S. PATENT DOCUMENTS

| | | | |
|---|---|---|---|
| 2009/0091009 A1* | 4/2009 | Corisis et al. | 257/670 |
| 2012/0018865 A1* | 1/2012 | Camacho | H01L 21/4832 257/676 |
| 2013/0009300 A1* | 1/2013 | Yato et al. | 257/676 |

OTHER PUBLICATIONS

Patent Abstracts of Japan, Publication No. 2009-060093, Publication Date Mar. 19, 2009.

* cited by examiner

SEMICONDUCTOR DEVICE HAVING FLAT LEADS

BACKGROUND OF THE INVENTION

1. Field of the Invention

The present invention relates to a resin-encapsulated semiconductor device, in particular, to a semiconductor device having a structure in which a lead for connection to a circuit board and an island for mounting a semiconductor chip thereon are exposed from a mold resin.

2. Description of the Related Art

Various electronic devices, including portable devices, are becoming thinner, smaller, and lighter. Semiconductor packages to be mounted on the electronic devices are also required to be thinner and smaller. Thinning and downsizing of the semiconductor package cannot be achieved by a related-art gullwing type semiconductor package. It is thus effective to employ a so-called flat package, in which lead ends are flat and a bottom surface of the semiconductor package and a bottom surface of the lead are level with each other.

The basic structure of the flat package is that a lead for connection to a circuit board is exposed from a rear surface of the package, which is a surface to be mounted on the circuit board. Further, an island is exposed from the rear surface of the package in some cases and not in other cases. The lead bottom surface and the package bottom surface are flat, and hence, when the package is mounted on the circuit board by solder, the solder comes into contact with a mold resin at the lead bottom surface and at the package bottom surface.

FIG. 18 illustrates a related-art semiconductor package. A bottom surface of a lead 1, a bottom surface of a mold resin 6, and a bottom surface of an island 3 are flush with one another.

The basic structure of the flat package is disclosed in Japanese Published Patent Application Nos. 2000-299400 and 2009-060093.

In the related-art structure, however, when the semiconductor package is mounted on the circuit board, the solder printed on the circuit board and the bottom surface of the mold resin are brought into contact with each other, and hence there is a problem in that the self-alignment property that automatically corrects a misalignment of the semiconductor package when the solder melts is reduced. When bonding alignment between the circuit board and the semiconductor package is lost, an effective bonding area between the lead of the semiconductor package and the solder printed on the circuit board is reduced to decrease mounting strength.

SUMMARY OF THE INVENTION

The present invention is aimed at solving the problem inherent in the related-art structure described above, and it is an object thereof to improve the self-alignment property of a semiconductor package to a circuit board and improve solder bonding strength.

In order to improve the self-alignment property, which is the above-mentioned problem, a lead exposed on a rear surface of a semiconductor package is lowered by one step with respect to a bottom surface of a mold resin of the semiconductor package, to thereby avoid contact between solder and the mold resin.

Further, in the case where a step cannot be formed on the lead and the bottom surface of the mold resin, a concave portion is formed in the mold resin at the periphery of the lead exposed from the bottom surface of the semiconductor package.

In addition, in the case of a package of a type in which an island is exposed from the rear surface of the semiconductor package, a concave portion is formed also in the mold resin at the periphery of an exposed part of the island, to thereby further improve the self-alignment property.

By forming a concave portion in a heat radiation plate on the rear surface of the semiconductor package so as to widen a bonding area to the solder, solder bonding strength between the semiconductor package and the circuit board is improved.

By carrying out the present invention, the self-alignment becomes more effective when the semiconductor package is mounted on the circuit board, and hence a mounting failure caused by misalignment of installation of the semiconductor package can be reduced. In particular, in the type in which the island of the semiconductor package is exposed, by forming the concave portion in the mold resin in the vicinity of the heat radiation plate, the self-alignment property is further improved. Further, by forming the concave portion also in the heat radiation plate, the bonding area to the solder can be increased to improve the mounting strength.

DETAILED DESCRIPTION OF THE INVENTION

Exemplary embodiments of the present invention are described in detail below with reference to the accompanying drawings.

First Embodiment

Figure 1:
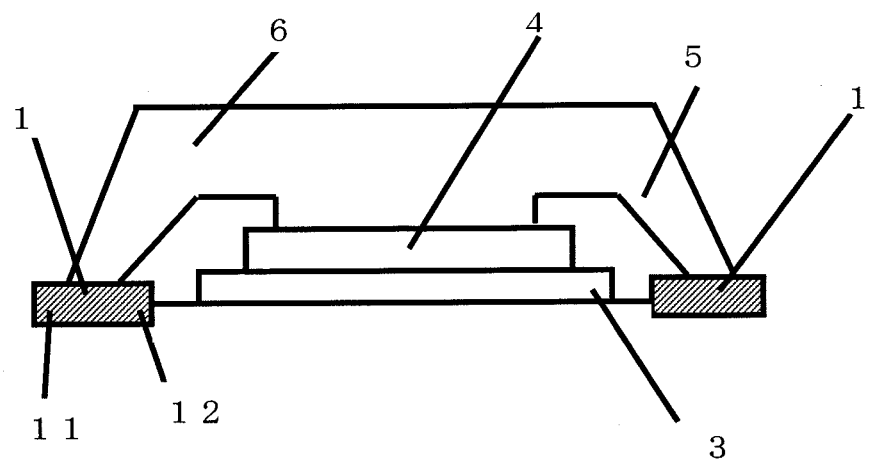
FIG. 1 is a cross-sectional view of a semiconductor device according to a first embodiment of the present invention.

FIG. 1 is a cross-sectional view of a semiconductor device according to a first embodiment of the present invention. A semiconductor chip 4 is mounted on an island 3 with use of an adhesive or the like. Electrodes on a front surface of the semiconductor chip 4 are connected to a plurality of leads 1 via wires 5. The semiconductor chip 4, the wires 5, the island 3, and the leads 1 are encapsulated with a mold resin 6 as an insulating resin. The leads 1 and the island 3 are insulated from each other by the mold resin 6 with a space therebetween. In this state, a bottom surface of the island 3, a bottom surface of the lead 1, an outer side surface 11 of the lead 1, which is located on an outer side of a side surface of the mold resin 6, and a lower part of an inner side surface 12 of the lead 1, which is located under a bottom surface of the mold resin 6, are exposed from the mold resin 6. The bottom surface of the lead 1 is not flush with the bottom surface of the island 3, but a step (standoff) is formed so that the bottom surface of the lead 1 may be lower than the bottom surface of the island 3 by one step toward a mounting surface side of a circuit board. The inner side surface of the lead 1 is accordingly partially exposed from the mold resin.

With the step formed in this manner, when the semiconductor package is bonded or solder printed on the circuit board, the lead 1 is bonded on the circuit board, but the island 3 and the mold resin at the periphery of the island are spaced apart from the circuit board. The solder is thus prevented from coming around a region other than the lead 1 of the semiconductor device, and hence self-alignment property can be improved to increase an effective bonding area and thereby improve mounting strength. This effect is obtained when the amount of the step is about 0.01 mm to about 0.05 mm.

Figure 2:
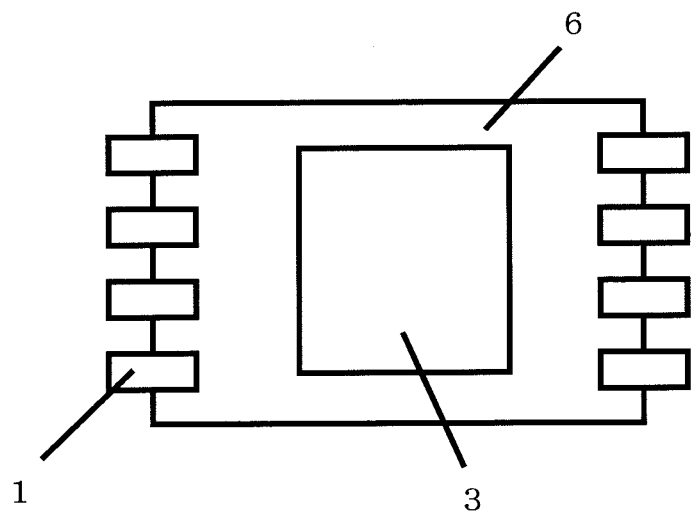
FIG. 2 is a rear view of the semiconductor device according to the first embodiment of the present invention.

FIG. 2 is a view of the semiconductor device illustrated in FIG. 1 when viewed from the lead bottom surface side. The semiconductor device has a convex structure in which the island 3 and the mold resin 6 at the periphery of the island are flush with each other but the leads 1 protrude toward the front of the drawing sheet. In other words, the island 3 and the bottom surface of the mold resin 6 are structured to be concave in the depth direction of the drawing sheet.

Second Embodiment

Figure 3:
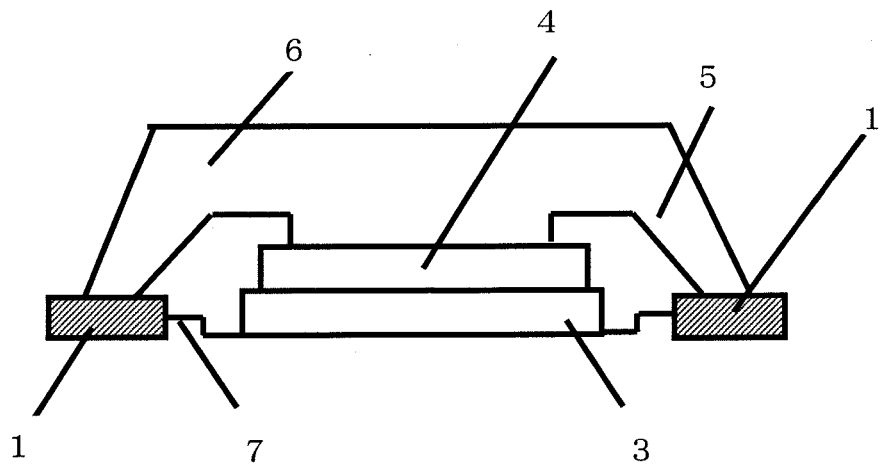
FIG. 3 is a cross-sectional view of a semiconductor device according to a second embodiment of the present invention.

FIG. 3 is a cross-sectional view of a semiconductor device according to a second embodiment of the present invention, illustrating a flat lead type semiconductor device. Similarly to FIG. 1, FIG. 3 illustrates a semiconductor package of a type in which the island 3 is exposed. As illustrated in FIG. 3, a concave portion 7 is formed in the mold resin 6 at a part adjacent to the lead 1, thereby exposing a lower part of the inner side surface of the lead 1 located under the bottom surface of the mold resin 6. The bottom surface of the island 3 and the bottom surface of the mold resin 6 in the vicinity of the island are flush with the bottom surface of the lead 1. With this structure, the self-alignment property can be ensured, and also heat radiation property from the island 3 to the circuit board can be ensured. This effect is obtained when the amount of the step of the concave portion is about 0.01 mm to about 0.05 mm.

Figure 4:
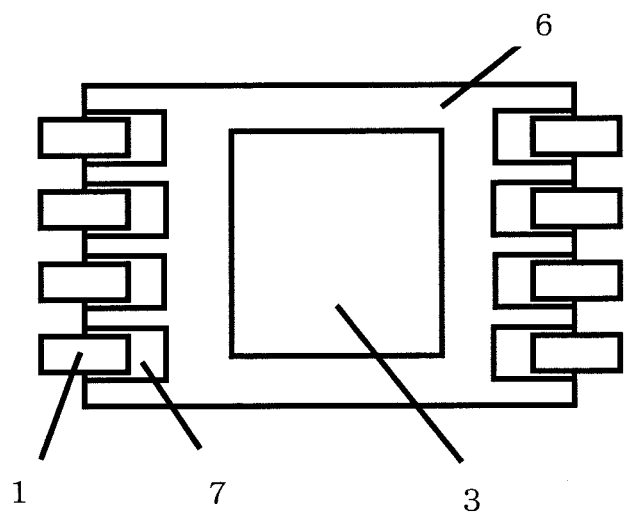
FIG. 4 is a rear view of the semiconductor device according to the second embodiment of the present invention.

FIG. 4 is a view of the semiconductor package of FIG. 3 when viewed from the bottom surface side.

As illustrated in FIG. 4, the concave portion 7 is formed in the mold resin 6 to have a "U-shape" along the periphery of the lead 1, and the concave portion 7 exposes the lower parts of the side surfaces which surround the bottom surface of the lead 1. The concave portion 7 thus produces the self-alignment effect for two-dimensional misalignment (in X direction and Y direction) of the solder printed on the circuit board.

Third Embodiment

Figure 5:
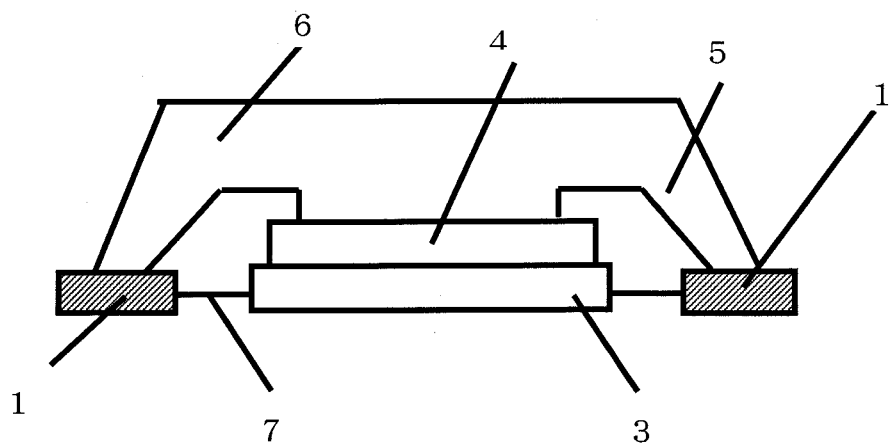
FIG. 5 is a cross-sectional view of a semiconductor device according to a third embodiment of the present invention.
Figure 6:
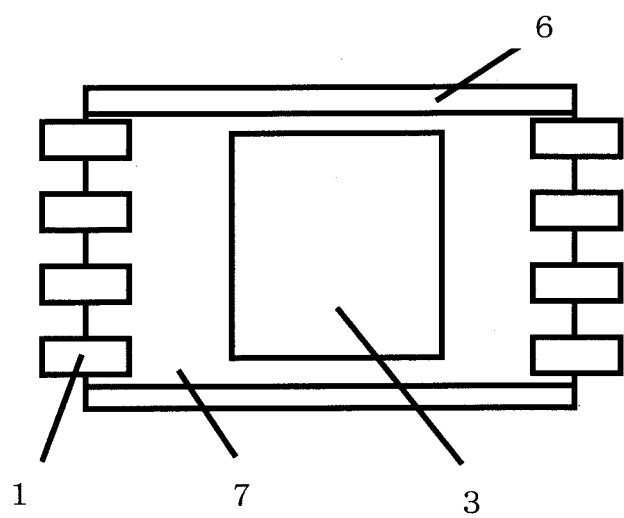
FIG. 6 is a rear view of the semiconductor device according to the third embodiment of the present invention.

FIG. 5 is a cross-sectional view of a semiconductor device according to a third embodiment of the present invention, illustrating a state in which the concave portion 7 illustrated in FIG. 3 is extended to the island 3. FIG. 6 is a view of the semiconductor package illustrated in FIG. 5 when viewed from the rear surface side. The concave portion 7 of the mold resin 6 is formed to extend continuously not only to the periphery of the inner side surface of the lead 1 but also to the periphery of the island 3 and exposes the lower parts of the side surfaces that surround the bottom surface of the lead. Also the side surface of the island 3 is accordingly partially exposed from the mold resin. In FIG. 6, a part of the bottom surface of the mold resin 6 protrudes toward the front of the drawing sheet along the vertical edges of the semiconductor package of FIG. 6. The protruding part forms a bottom surface flush with the bottom surfaces of the island 3 and the lead 1.

Fourth Embodiment

Figure 7:
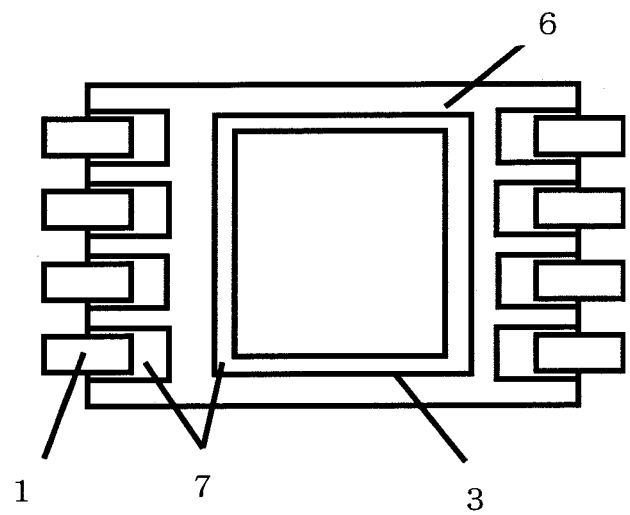
FIG. 7 is a rear view of a semiconductor device according to a fourth embodiment of the present invention.

FIG. 7 is a rear view of a semiconductor device according to a fourth embodiment of the present invention, illustrating a type in which the concave portions are provided individually at the periphery of the inner side surface of the lead 1 and at the periphery of the island 3. The semiconductor package illustrated in FIG. 7 is more advantageous in downsizing. The reason is as follows. When the semiconductor package is downsized, the distance between the lead 1 and the island 3 becomes smaller. If the mold resin between the lead and the island is formed to be convex, solder short can be prevented in mounting of the circuit board.

Fifth Embodiment

Figure 8:
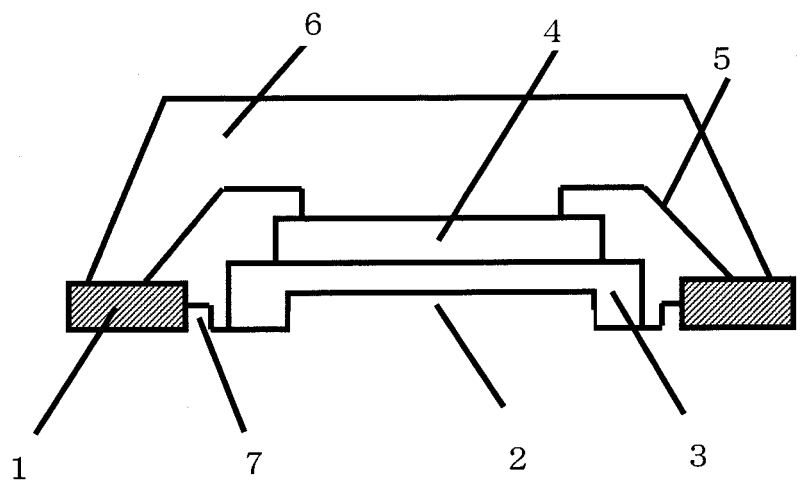
FIG. 8 is a cross-sectional view of a semiconductor device according to a fifth embodiment of the present invention.

FIG. 8 is a cross-sectional view of a semiconductor device according to a fifth embodiment of the present invention, illustrating a type in which a concave portion 2 is provided inside the rear surface (bottom surface) of the island 3 of the semiconductor device illustrated in FIG. 3. By forming the concave portion 2 in this manner, the surface area of the rear surface of the island 3 is increased. The effective contact area to the solder is thus increased to improve solder bonding strength. This effect is obtained when the amount of the step of the concave portion is about 0.01 mm to about 0.05 mm.

Figure 9:
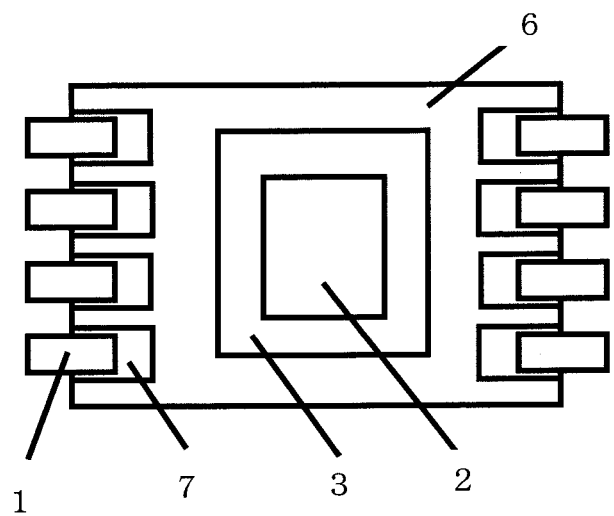
FIG. 9 is a rear view of the semiconductor device according to the fifth embodiment of the present invention.

FIG. 9 is a view of the semiconductor package illustrated in FIG. 8 when viewed from the rear surface side.

Sixth Embodiment

Figure 10:
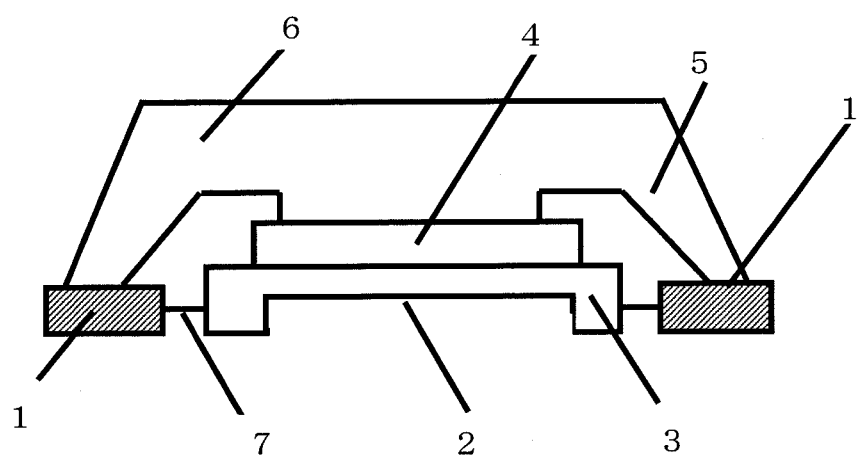
FIG. 10 is a cross-sectional view of a semiconductor device according to a sixth embodiment of the present invention.

FIG. 10 is a cross-sectional view of a semiconductor device according to a sixth embodiment of the present invention, illustrating a type in which the concave portion 7 of the mold resin of FIG. 8 is extended to the island 3.

Seventh Embodiment

Figure 11:
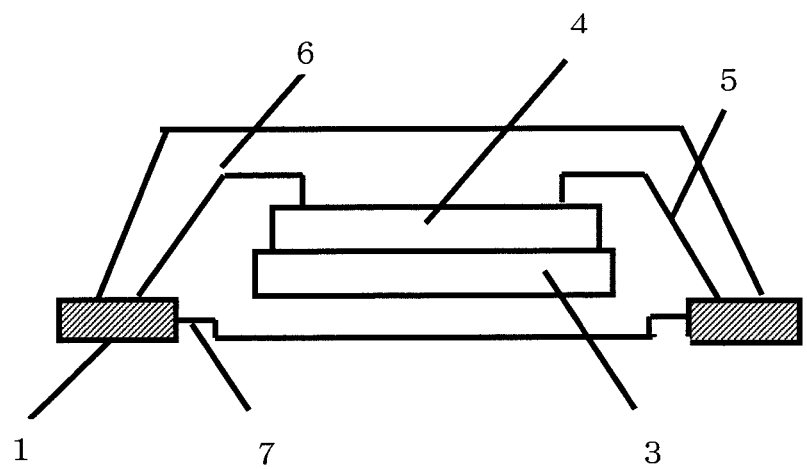
FIG. 11 is a cross-sectional view of a semiconductor device according to a seventh embodiment of the present invention.

FIG. 11 is a cross-sectional view of a semiconductor device according to a seventh embodiment of the present invention, illustrating a type in which the island 3 is not exposed from the rear surface of the semiconductor package. The concave portion 7 is formed in the mold resin 6 at a part adjacent to the lead 1.

Figure 12:
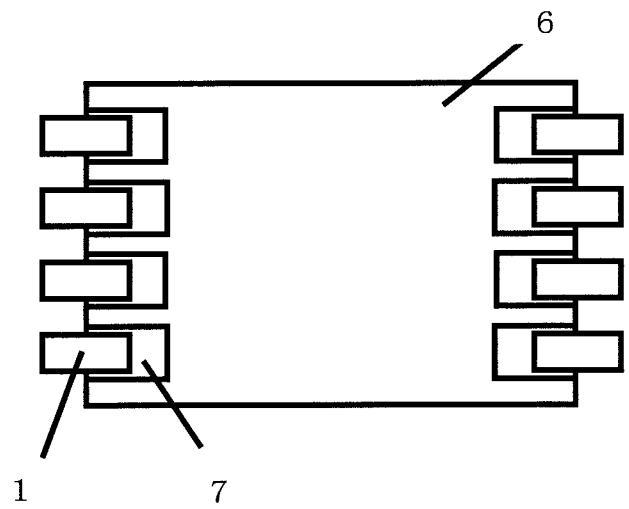
FIG. 12 is a rear view of the semiconductor device according to the seventh embodiment of the present invention.

FIG. 12 is a rearview of the semiconductor device illustrated in FIG. 11.

Eighth Embodiment

Figure 13:
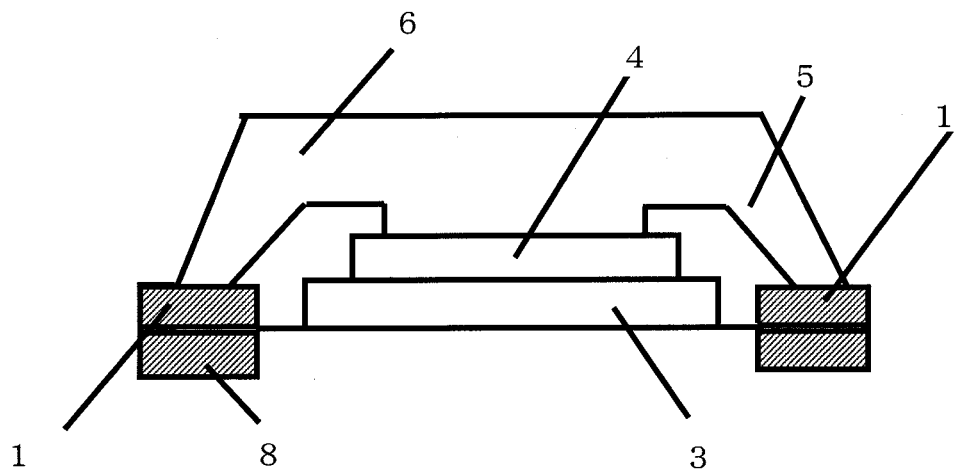
FIG. 13 is a cross-sectional view of a semiconductor device according to an eighth embodiment of the present invention.

FIG. 13 is a cross-sectional view of a semiconductor device according to an eighth embodiment of the present invention.

The lead is extended in advance as an outer lead, and an intermediate part of the outer lead is folded back so that an upper lead and a lower lead 8 are stacked to form a double lead. The double lead thus has a structure in which the upper and lower leads are bonded at an outer end of the semiconductor device. By forming such a structure, a step (standoff) corresponding to the thickness of the lead can be formed on the bottom surface of the lower lead 8 and the bottom surface of the island 3, and hence the self-alignment property can be improved to increase the effective bonding area and thereby improve the mounting strength. All side surfaces of the lower lead are exposed. Although depending on the thickness of the lead, the amount of the step in this case is determined to be about 0.01 mm to about 0.1 mm. Further, although the example of the double lead is illustrated in FIG. 13, the lead structure may be a stacked structure having three or more leads.

Ninth Embodiment

Figure 14:
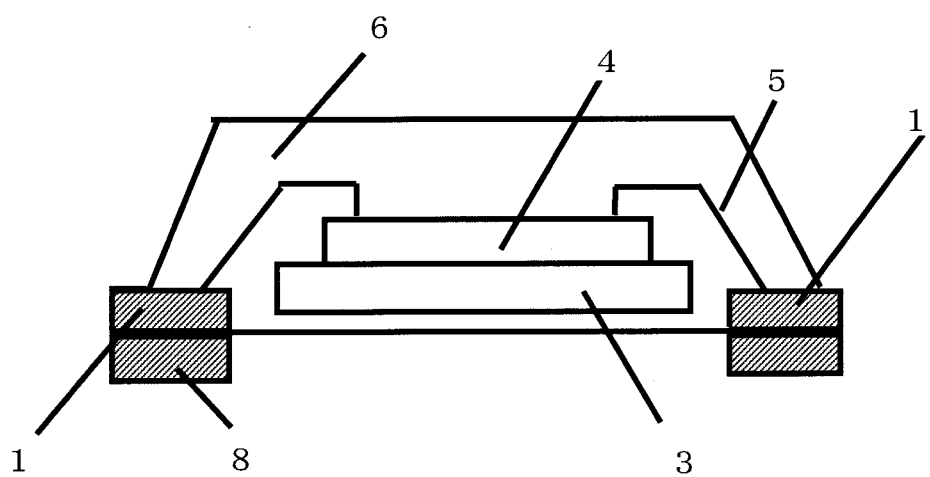
FIG. 14 is a cross-sectional view of a semiconductor device according to a ninth embodiment of the present invention.

FIG. 14 is a cross-sectional view of a semiconductor device according to a ninth embodiment of the present invention. A semiconductor package of FIG. 14 is similar to the semiconductor package illustrated in FIG. 13, and is of a type in which the island 3 is not exposed from the mold resin 6.

Tenth Embodiment

Figure 15:
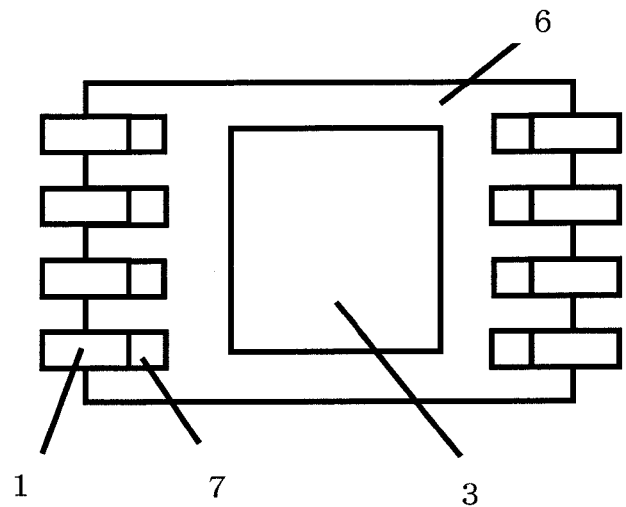
FIG. 15 is a rear view of a semiconductor device according to a tenth embodiment of the present invention.

FIG. 15 is a rear view of a semiconductor device according to a tenth embodiment of the present invention, illustrating a modification from FIG. 4. The concave portion 7 in the vicinity of the leads is not formed between the leads but formed only in the direction toward the island. This structure supports the case where the leads are formed at a narrow pitch.

Eleventh Embodiment

Figure 16:
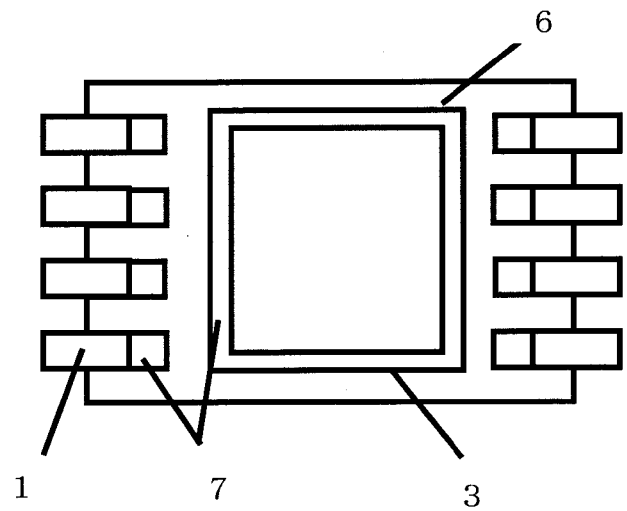
FIG. 16 is a rear view of a semiconductor device according to an eleventh embodiment of the present invention.

FIG. 16 is a rear view of a semiconductor device according to an eleventh embodiment of the present invention. On the basis of the embodiment illustrated in FIG. 15, the concave portion 7 is formed adjacent to the outer periphery of the island.

Twelfth Embodiment

Figure 17:
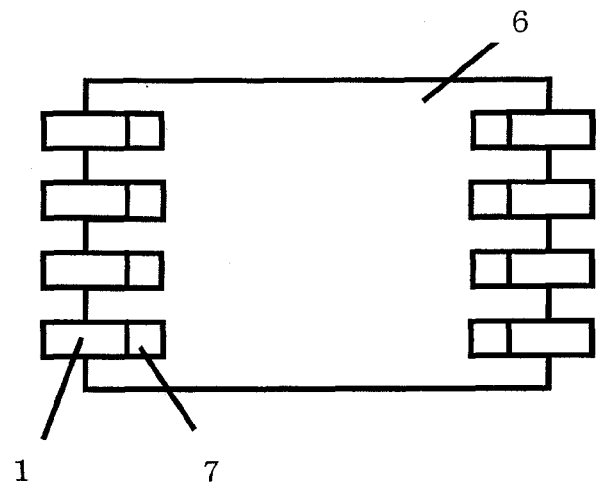
FIG. 17 is a rear view of a semiconductor device according to a twelfth embodiment of the present invention.
Figure 18:
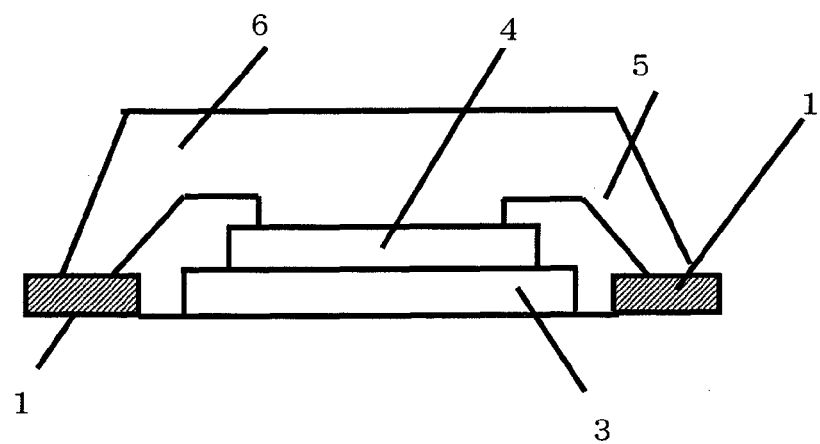
FIG. 18 is a cross-sectional view of a related-art semiconductor device.

FIG. 17 is a rear view of a semiconductor device according to a twelfth embodiment of the present invention. On the basis of the embodiment illustrated in FIG. 12, no concave portion is formed between leads, but the concave portion 7 is formed only in the direction toward the island covered with the mold resin.

What is claimed is:

1. A semiconductor device of a flat lead type, comprising:
a semiconductor chip mounted on an island;
a plurality of leads spaced from the island and connected by wires to the semiconductor chip, the leads each having top, bottom and side surfaces; and
an insulating resin encapsulating the island, the semiconductor chip, the wires, and the leads, the insulating resin having top, bottom and side surfaces and having a first concave portion formed therein at a part in contact with the leads, the first concave portion being configured so that the bottom surface of each lead, an outer side surface of each lead that is located on an outer side of the side surface of the insulating resin, and a lower part of an inner side surface of each lead that is located under the bottom surface of the insulating resin, are exposed from the insulating resin.

2. A semiconductor device according to claim 1, wherein the first concave portion is disposed in a region at which the leads are opposed to the island.

3. A semiconductor device according to claim 2, wherein the first concave portion is disposed also between adjacent leads.

4. A semiconductor device according to claim 3, wherein the first concave portion is disposed also in the insulating resin adjacent to a periphery of the island.

5. A semiconductor device according to claim 4, wherein the first concave portion formed in a part adjacent to the leads and the first concave portion disposed in the insulating resin adjacent to the periphery of the island are formed by a continuous concave portion.

6. A semiconductor device according to claim 4, wherein the first concave portion formed in a part adjacent to the leads and the first concave portion disposed in the insulating resin adjacent to the periphery of the island are separated and spaced apart from one another.

7. A semiconductor device according to claim 1, wherein the island has a second concave portion disposed in a rear surface thereof exposed from the insulating resin.

8. A semiconductor device according to claim 7, wherein one of the first concave portion and the second concave portion has a depth of from 0.01 mm to 0.05 mm.

9. A semiconductor device of a flat lead type, comprising:
a semiconductor chip mounted on an island;
a plurality of leads spaced from the island and connected by wires to the semiconductor chip; and
an insulating resin that encapsulates the island, the semiconductor chip, the wires, and the leads, the insulating resin having top, bottom and side surfaces,
each of the leads having a bottom surface exposed from the insulating resin, and
each of the leads including a lower lead, which is obtained by folding back the lead so that an upper lead and the lower lead are stacked on one another, the lower lead being disposed entirely below a bottom surface of the insulating resin and having side surfaces which surround the bottom surface and which are exposed from the insulating resin, and the lower and upper leads projecting outwardly beyond the side surface of the insulating resin.

10. A semiconductor device according to claim 9, wherein a plurality of the lower leads are stacked on one another.

11. A semiconductor device of a flat lead type, comprising:
a semiconductor chip mounted on an island;
a plurality of leads spaced from the island and connected by wiring to the semiconductor chip; and
an insulating resin that encapsulates the island, the semiconductor chip, the wires, and the leads,
each of the leads having a bottom surface exposed from the insulating resin, and
each of the leads having side surfaces which surround the bottom surface and which extend below a bottom surface of the island.

12. A semiconductor device according to claim 11, wherein the side surfaces extend 0.01 mm to 0.05 mm below the bottom surface of the island.

13. A semiconductor device according to claim 7, wherein the second concave portion is disposed along the periphery of the island.

14. A semiconductor device according to claim 13, wherein the first and second concave portions are formed in, and separated from each other by, the insulating resin.

15. A semiconductor device according to claim 14, wherein the first and second concave portions are formed in, and separated from each other by, the insulating resin.

* * * * *